US006462984B1

(12) United States Patent
Xu et al.

(10) Patent No.: US 6,462,984 B1
(45) Date of Patent: Oct. 8, 2002

(54) BIASING SCHEME OF FLOATING UNSELECTED WORDLINES AND BITLINES OF A DIODE-BASED MEMORY ARRAY

(75) Inventors: Daniel Xu, Mountain View; Tyler A. Lowrey, San Jose, both of CA (US); David L. Kencke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,599

(22) Filed: Jun. 29, 2001

(51) Int. Cl.[7] ............................................. G11C 11/36
(52) U.S. Cl. ........................ 365/175; 365/174; 365/163; 365/148; 365/203; 365/225.7; 365/51
(58) Field of Search ................................. 365/148, 163, 365/175, 174, 203, 225.7, 96, 100, 57, 63, 105, 103

(56) References Cited

U.S. PATENT DOCUMENTS

| | | | |
|---|---|---|---|
| 3,271,591 A | 9/1966 | Ovshinsky | 327/500 |
| 3,530,441 A | 9/1970 | Ovshinsky | 365/113 |
| 5,296,716 A | 3/1994 | Ovshinsky et al. | 257/3 |
| 5,737,259 A | * 4/1998 | Chang | 365/105 |
| 5,789,758 A | 8/1998 | Reinberg | 257/3 |
| 5,879,955 A | 3/1999 | Gonzalez et al. | 438/128 |
| 5,920,499 A | * 7/1999 | Chang | 365/105 |
| 5,920,788 A | 7/1999 | Reinberg | 438/466 |
| 5,933,365 A | 8/1999 | Klersy et al. | 365/148 |
| 5,962,900 A | * 10/1999 | Chou et al. | 257/368 |
| 5,970,336 A | 10/1999 | Wolstenholme et al. | 438/238 |
| 5,998,244 A | 12/1999 | Wolstenholme et al. | 438/128 |
| 6,002,140 A | 12/1999 | Gonzalez et al. | 257/3 |
| 6,031,287 A | 2/2000 | Harshfield | 257/734 |
| 6,085,341 A | 7/2000 | Greason et al. | 714/718 |
| 6,087,674 A | 7/2000 | Ovshinsky et al. | 257/2 |
| 6,141,241 A | 10/2000 | Ovshinsky et al. | 365/163 |
| 6,153,890 A | 11/2000 | Wolstenholme et al. | 257/3 |
| 6,229,157 B1 | 5/2001 | Sandhu | 257/75 |

* cited by examiner

Primary Examiner—Andrew Q. Tran
(74) Attorney, Agent, or Firm—Tony M. Martinez (57) ABSTRACT

An integrated circuit (IC) has a number of memory cells, each of which has a diode structure coupled between a bitline and a wordline that are selected when programming that cell. A target memory cell of the IC is programmed while simultaneously floating a number of unselected bitlines and wordlines in the IC.

20 Claims, 6 Drawing Sheets

BIASING SCHEME OF FLOATING UNSELECTED WORDLINES AND BITLINES OF A DIODE-BASED MEMORY ARRAY

BACKGROUND

This invention is generally related to techniques programming an array of memory cells (in a solid state integrated circuit device) that have a diode structure within each cell, and particularly related to a scheme for biasing the unselected wordlines and bitlines of the array, while applying a programming pulse to the selected wordline and bitline, to reduce reverse leakage of the diode structures in the array.

A diode structure can appear in a memory cell for a variety of reasons. For instance, in certain types of solid state memory devices that use a structural phase-change material as the programmable data storage mechanism, a parasitic diode is formed in series with the phase-change material. If the array is large and increased power consumption in the overall system is a concern, then the cumulative effect of reverse leakage in a large number of unselected cells becomes a problem whenever a small number of selected cells are being programmed. To help explain this problem, it is instructive to understand the circuitry in an exemplary memory cell and how a diode-based memory is programmed conventionally.

Figure 1:
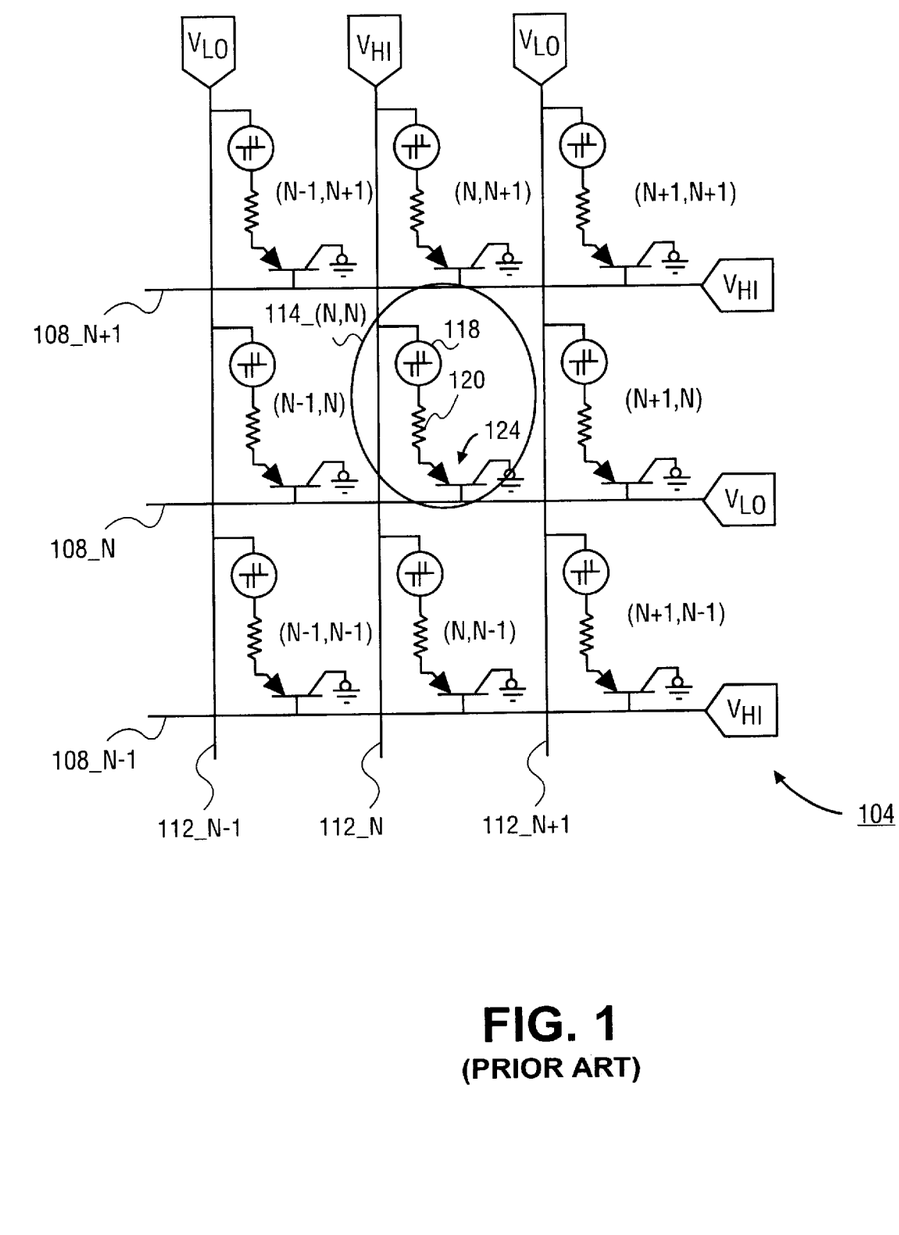
FIG. 1 shows a circuit schematic of part of an array of phase-change material memory cells while they are subjected to a conventional programming scheme.

FIG. 1 shows a schematic circuit of part of an array 104 of diode-based phase-change material memory cells. The array 104 has a number of vertically oriented conductive lines 112__1, 112__2, . . . 112__n-1, 112__n, 112__n+1, . . . (112), sometimes called bitlines, and a number of horizontally oriented conductive lines 108__1, 108__2, . . . 108__n-1, 108__n, 108__n+1, . . . (108), sometimes called wordlines. The cross-point matrix arrangement of the bitlines 112 and the wordlines 108 allows each crossing of a bitline-wordline pair to be associated with a separate memory cell 114 having an index (i, j). To make it easier to explain the programming technique, only a 3×3 matrix of cells 114, immediately surrounding the 114__(n,n) cell, is shown in FIG. 1. This description, however, is applicable to virtually any size of memory array.

To achieve low manufacturing costs in large volumes, every memory cell 114 in the array 104 may be designed to have the same structure. Thus, the cells are described using only one representative cell 114__(n,n), where it is clear that the following description is applicable to all other cells in the array. The memory cell 114__(n,n) has a diode structure 124 coupled between a separate bitline-wordline pair 112__n-108__n that is selected when programming the cell 114__(n,n). The diode structure 124 is oriented such that its forward current is in the bitline-to-wordline direction. In addition, the memory cell 114__(n,n) has a volume of phase-change material 118 in series with the diode structure 124 and coupled between the bitline-wordline pair 112__n-108__n. A fixed value matching resistor 120 is also in series with the diode structure 124, coupled between the phase-change material 118 and the diode structure 124. The material 118 acts as a programmable resistor and changes from one resistivity state to another, corresponding to a change from one type of structure to another, when the cell has been programmed.

Programming the memory cell 114 involves passing a current pulse through the phase-change material in that cell. This can be done by subjecting the bitline-wordline pair 112__n-108__n of a target memory cell 114__(n,n) to $V_{hi}$ and $V_{lo}$, respectively. The difference $V_{hi}-V_{lo}$ is sufficiently large so as induce the required programming current in the phase-change material. For instance, in a typical phase-change memory, a $V_{hi}-V_{lo}$ of 2.5 Volts is sufficient to 'reset' the cell.

When one or more target memory cells are being programmed, the states of other cells in the array 104 should not be affected. In a conventional programming scheme applied to the array 104 shown in FIG. 1, this is achieved by first applying and maintaining $V_{hi}$ on all wordlines 108 and $V_{lo}$ on all bitlines 112. This biasing scheme will strongly reverse-bias each diode structure 124 in every cell 114 of the array 104, thereby causing a diode reverse leakage current through the phase-change material. Even at a relatively strong reverse-bias voltage of 2.5 Volts, the reverse leakage current is so small that the state of the phase-change material (and hence the cell) does not change.

While the diode structures in all cells are kept strongly reverse-biased as described in the previous paragraph, those bitline-wordline pairs that correspond to target memory cells are selected to be programmed. This is done by applying a pulse of $V_{lo}$ on the selected wordlines and $V_{hi}$ on the selected bitlines, while simultaneously keeping the unselected wordlines and bitlines at $V_{hi}$ and $V_{lo}$, respectively. This condition of the array 104 which happens during the programming pulse is depicted FIG. 1 where wordline 108__n and bitline 112__n are the selected bitline-wordline pair (corresponding to the target cell being cell 114__(n,n)). Except for the target cell 114__(n,n), it can be seen that the diodes in the other cells that are coupled to the selected bitline-wordline pair are zero voltage biased, and hence the state of these cells is not affected. All other cells of the array 104 that are coupled to the unselected wordlines and bitlines, however, remain strongly reverse-biased.

A problem with the conventional programming scheme described above is that biasing the unselected wordlines and bitlines at $V_{hi}$ and $V_{lo}$, respectively, causes a relatively large, cumulative leakage current in a large array. For instance, consider a memory device having 1,000,000 cells arranged in a 1000×1000 array. Each time a cell in the device is programmed, the cells that are coupled to the 999 unselected wordlines and the 999 unselected bitlines are strongly reverse-biased at $V_{hi}-V_{lo}$. This means that the cumulative leakage current immediately before and during the programming of a single cell in such a device is on the order of 999×999 times the reverse leakage of one cell. This relatively high, cumulative leakage current in a memory device is not acceptable in many low power applications such as portable computing devices. Although a reduction in $V_{hi}-V_{lo}$ will lower the leakage current, such a flexibility in the programming voltage may generally not be available due to the programming requirements of the cells. As an alternative, the diode structure in the cell may be specially designed to have extremely low leakage, even while strongly reverse biased. That solution, however, will increase the cost of manufacturing the device, due to special fabrication process steps or large cell area needed to form the diode structure separate from the rest of the circuitry in the device.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, the unselected bitlines and unselected wordlines of a memory cell array in an integrated circuit (IC) are floated while simultaneously programming a target memory cell of the IC. Such a technique allows arrays in which the cells each have a diode structure coupled between a bitline and a wordline to exhibit reduced reverse leakage current in the diodes, without having to lower the programming voltages that are applied to the cells. Although leaving an electrical node floating is conventionally considered to be undesirable because of the possibility of the node floating to an undetermined voltage during operation, floating the unselected bitlines and wordlines of the diode-based memory cell array does not appear to create a risk of malfunction in the array.

Figure 2:
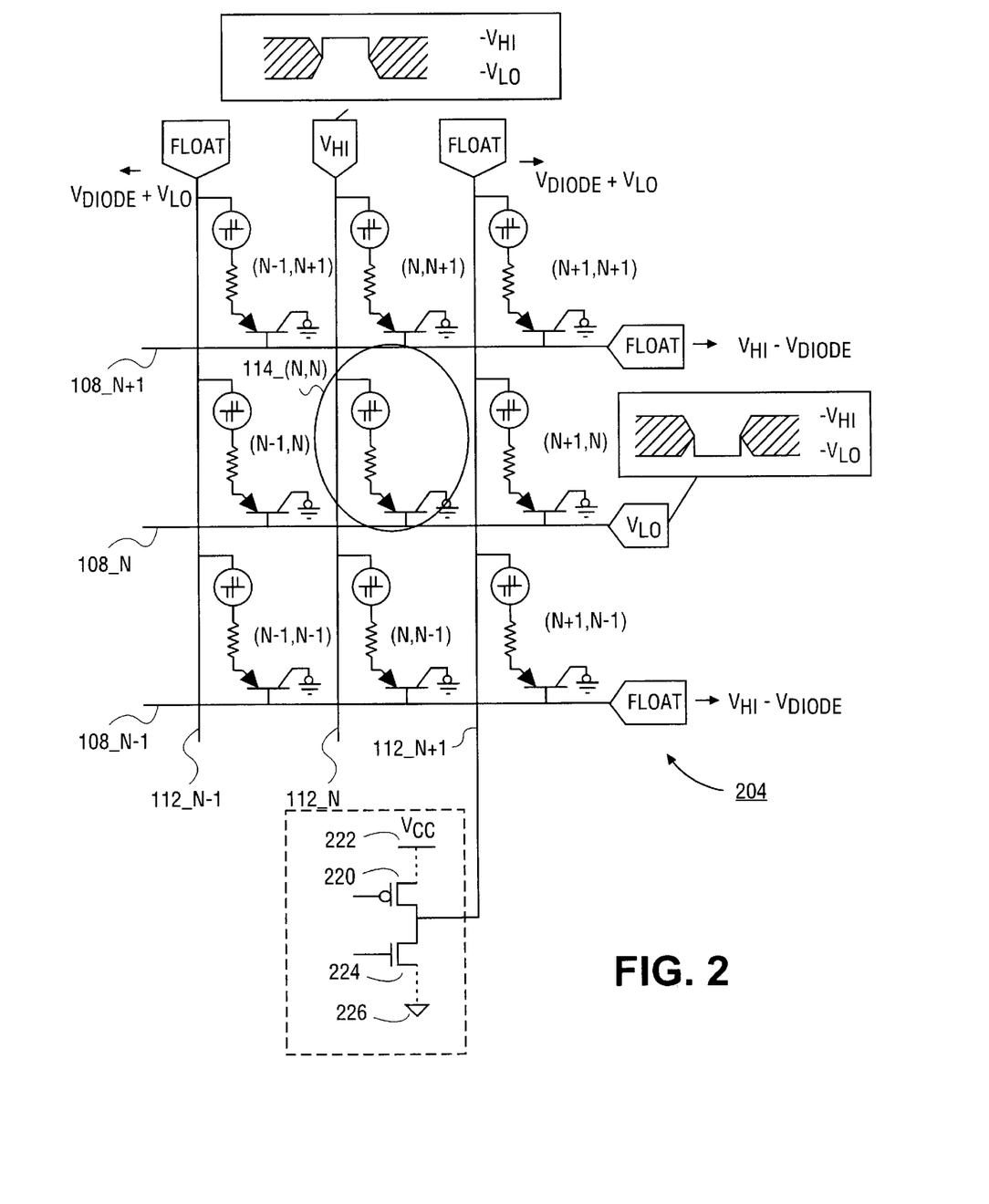
FIG. 2 illustrates a circuit schematic of part of a memory cell array while the array is subjected to a programming scheme according to an embodiment of the invention.

Turning now to FIG. 2, a circuit schematic of part of a memory cell array that is undergoing a biasing scheme of floating unselected wordlines and bitlines while programming a target memory cell is illustrated. The memory cell array 204 features a number of bitlines 112 and wordlines 108 arranged in a cross-point matrix, similar to that described above in connection with FIG. 1. It should be noted that the terms 'bitlines' and 'wordlines' originated with dynamic random access memory (DRAM) technology in which the bitline carried the stored information signal while the wordline carried the control signal. Here, however, they are used in a general sense to refer to conductive lines that are arranged in a cross-point matrix, for any type of solid state integrated circuit device that has the memory array 204. For the purposes of this description, the structure of the memory cell array 204 in FIG. 2 may be identical to the conventional array 104 shown in FIG. 1.

The memory cell array 204 shown in FIG. 2 is as mentioned above undergoing a biasing scheme in which the unselected bitlines 112_n−1 and 112_n+1, and unselected wordlines 108_n+1 and 108_n−1 are floating, while simultaneously the selected bitline-wordline pair 112_n and 108_n is subjected to a current pulse so as to cause the diode structure in the target memory cell 114_(n,n) to be pulsed in a forward bias direction. The direction of the forward bias current in the target memory cell is consistent with the difference $V_{hi}-V_{lo}$ being sufficiently large so as to induce the required programming current in the phase change material of the cell 114_(n,n). This current pulse may be induced by a conventional voltage pulse having a magnitude of 2.5 volts being sufficient to reset a phase-change memory cell. The invention is, of course, not limited to the use of any particular type of pulse or phase-change material in the memory cell. This material may be, for instance, a chalcogenide alloy that exhibits a reversible structural phase change from amorphous to crystalline. A small volume of the chalcogenide alloy is integrated into a circuit that allows the cell to act as a fast switching programmable resistor between a crystalline state (low resistivity) and the amorphous state (high resistivity), and is also capable of exhibiting multiple, intermediate states that allow multi-bit storage in each cell. The data stored in the cell is read by measuring the cell's resistance. The chalcogenide alloy cell is also non-volatile.

Figure 3:
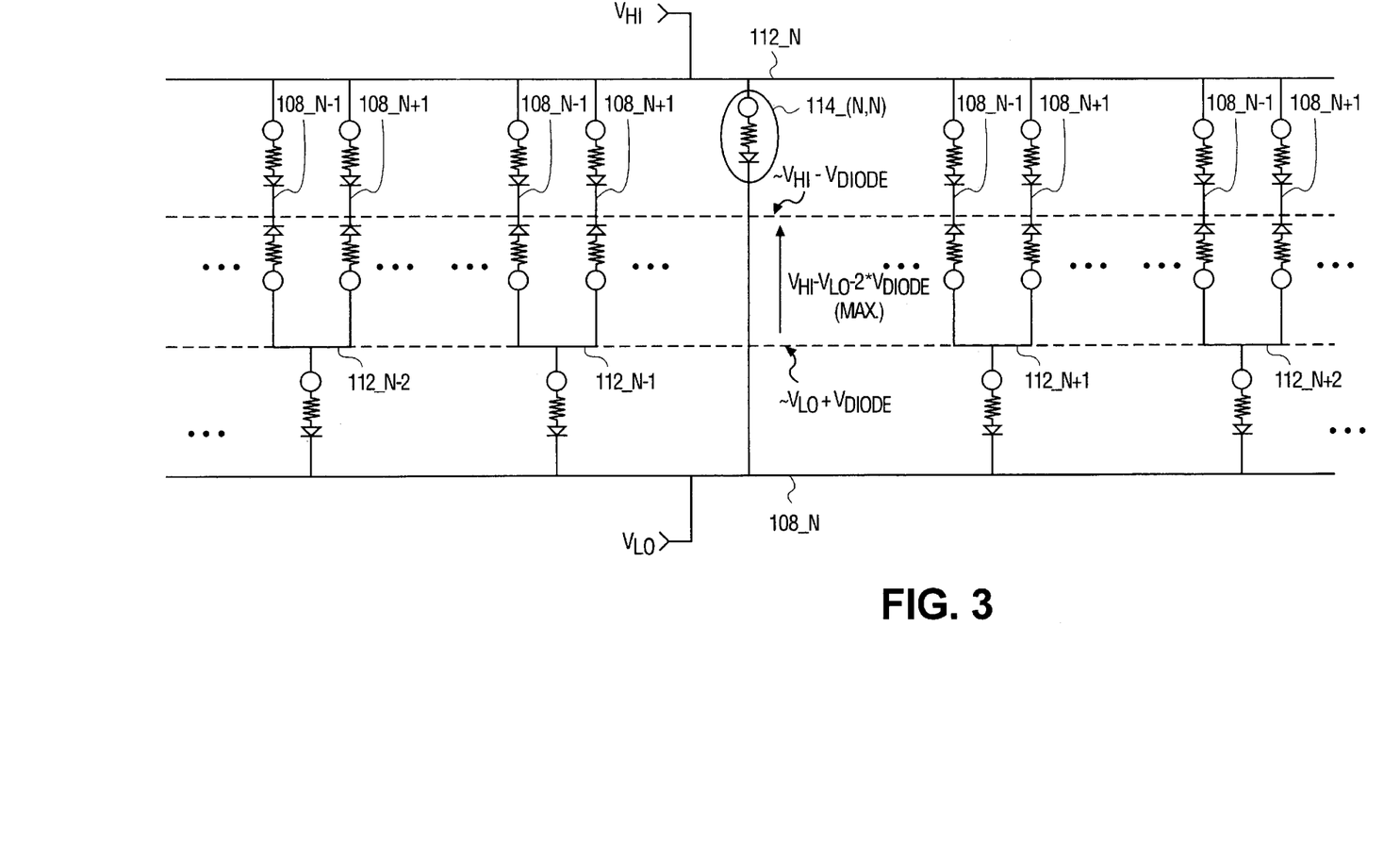
FIG. 3 depicts a circuit schematic of the memory cell array when the unselected bitlines and wordlines are floating, showing expected voltage levels for the floating nodes.

It is believed that a reduction in the cumulative leakage current of the memory array may be achieved by using the biasing scheme of floating the unselected wordlines and bitlines while programming the target memory cell. FIG. 3 helps explain this effect by illustrating a circuit schematic of the array 204 of FIG. 2, redrawn so that the reverse biased diode structures that are coupled to the unselected bitlines and wordlines are more readily apparent. This drawing allows an analysis of the possible voltage levels that the floating bitlines and wordlines may assume during programming of the target cell 114_(n,n). Continuing to refer to FIG. 3, two horizontal dotted lines are drawn, where the upper one crosses the floating/unselected wordlines 108_n−1, 108_n−2, . . . and 108_n+1, 108_n+2, . . . The lower dotted line crosses the floating/unselected bitlines 112_n−1, 112_n−2, . . . and 112_n+1, 112_n+2 . . . The selected bitline 112_n is at $V_{hi}$ while the selected wordline 108_n is at $V_{lo}$.

Since $V_{hi}$ is larger than $V_{lo}$, it is assumed that all of the diodes that are coupled between the unselected bitlines and unselected wordlines, shown in FIG. 3 as positioned between the two horizontal dotted lines, are reverse biased. However, rather than receiving the maximum reverse bias of $V_{hi}-V_{lo}$, these diodes receive a reverse bias of only up to $V_{hi}-V_{lo}-2*V_{diode}$. In other words, no cell that is coupled to an unselected bitline or an unselected wordline has its diode structure reverse-biased by more than essentially $V_{hi}-V_{lo}-2*V_{diode}$, where $V_{hi}-V_{lo}$ is the maximum programming voltage applied to a selected bitline and a selected wordline, and $V_{diode}$ is a forward voltage drop of the diode structure. In practice, the actual reverse bias may be substantially less for certain type of memory arrays, due to the voltage drops caused by any series coupled limiting resistors and memory cell storage media (e.g. phase-change material). By reducing the maximum reverse bias that is subjected to the unselected cells of the memory array, the cumulative leakage current of the array during programming is substantially reduced. With reduced leakage current, the array can be used in a wider range of applications, including as part of a dedicated memory device used in applications in which power consumption is a concern such as portable computing devices. This greater acceptance of the memory array is obtained without having to redesign the diode structure or other circuitry in each cell of the array.

The reduced reverse bias as mentioned above can be obtained by floating the unselected bitlines and wordlines of the memory array. Floating a node may be viewed as causing that node to have a high impedance to a power supply node and a power return node which are used to derive the programming voltages in the memory array. Such high impedance may be obtained by placing in the cutoff mode all transistors that directly drive the unselected bitlines and unselected wordlines. This is depicted by the example in FIG. 2 in which the unselected bitline 112_n+1 is coupled so as to be directly driven by a stacked p-channel and n-channel metal oxide semiconductor field effect transistor (MOSFET) pair 220 and 224, coupled between a power supply node 222 (at Vcc) and a power return node 226 (at ground). The programming voltage $V_{hi}$ can appear on the bitline 112_n+1 when the MOSFET pair 220, 224 is actively driven during the programming pulse.

Figure 4:
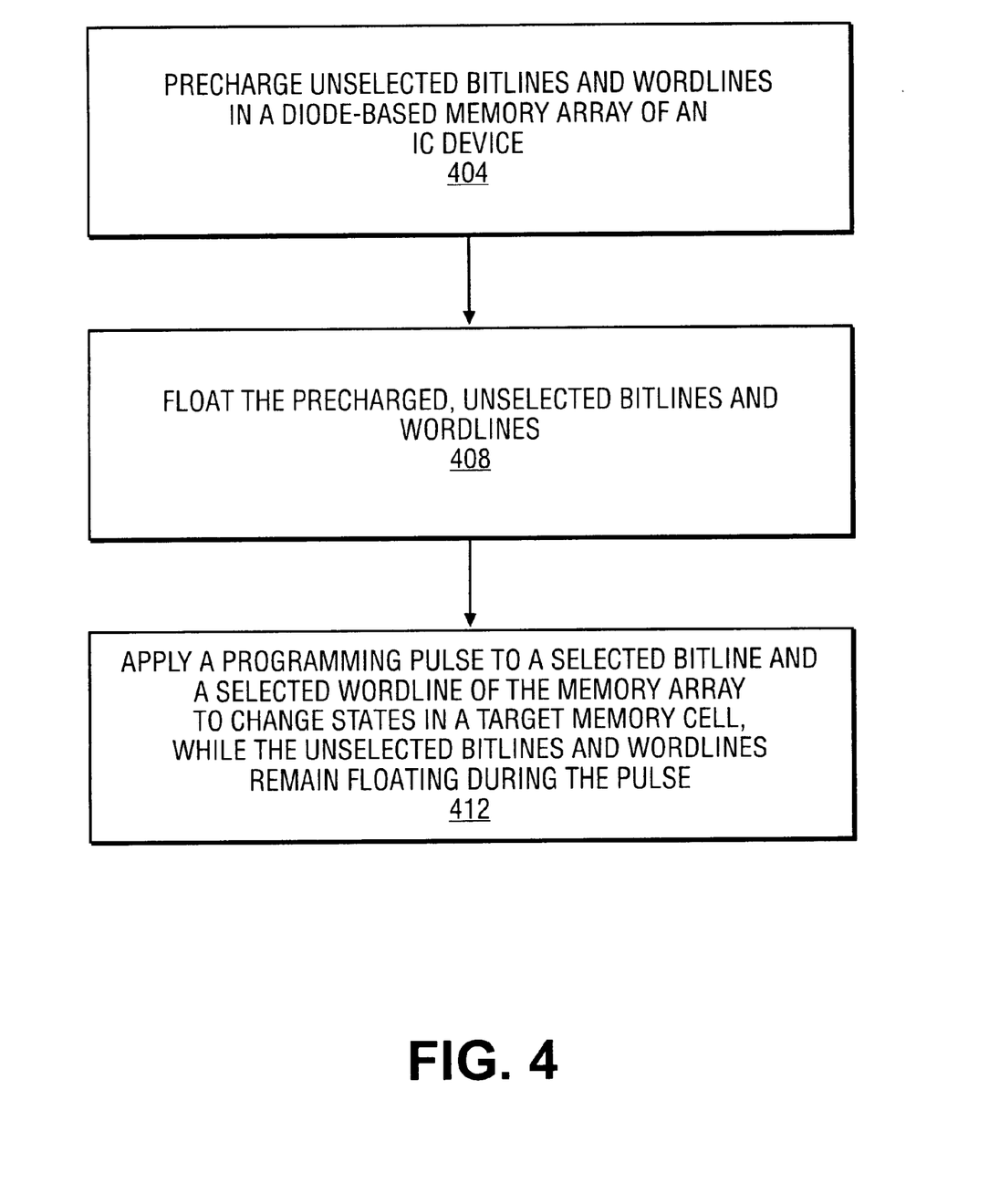
FIG. 4 shows a flow diagram of operations for programming a memory cell array according to an embodiment of the invention.

Turning now to FIG. 4, what's shown is a flow diagram of a method for programming a target memory cell according to an embodiment of the invention. This particular embodiment begins with precharging a number of unselected bitlines and wordlines in the memory array (operation 404) and then floating the precharged, unselected bitlines and wordlines (operation 408) prior to applying a programming pulse to a selected bitline and a selected wordline (operation 412). The precharge operation 404 should not change the existing stored states in the memory array. It may charge the unselected bitlines to, for instance, $V_{diode}+V_{lo}$, and charge the unselected wordlines to, for instance, $V_{hi}-V_{diode}$; these are the voltages to which the unselected bitlines and wordlines are expected to float. It should be noted that although the precharge operation 404 is optional, its use may help minimize any spikes on the supply and return nodes caused by the application of the programming pulse in operation 412. As mentioned above, the floating of the unselected bitlines and wordlines may be performed by causing each of these unselected bitlines and wordlines to have a high impedance to a power supply node and a power return node of the integrated circuit, where these power supply and power return nodes are used to derive the programming voltage that will be applied in operation 412. This high impedance may be obtained by placing in cutoff all transistors (not shown) that directly drive the unselected bitlines and wordlines of the memory array.

Figure 5:
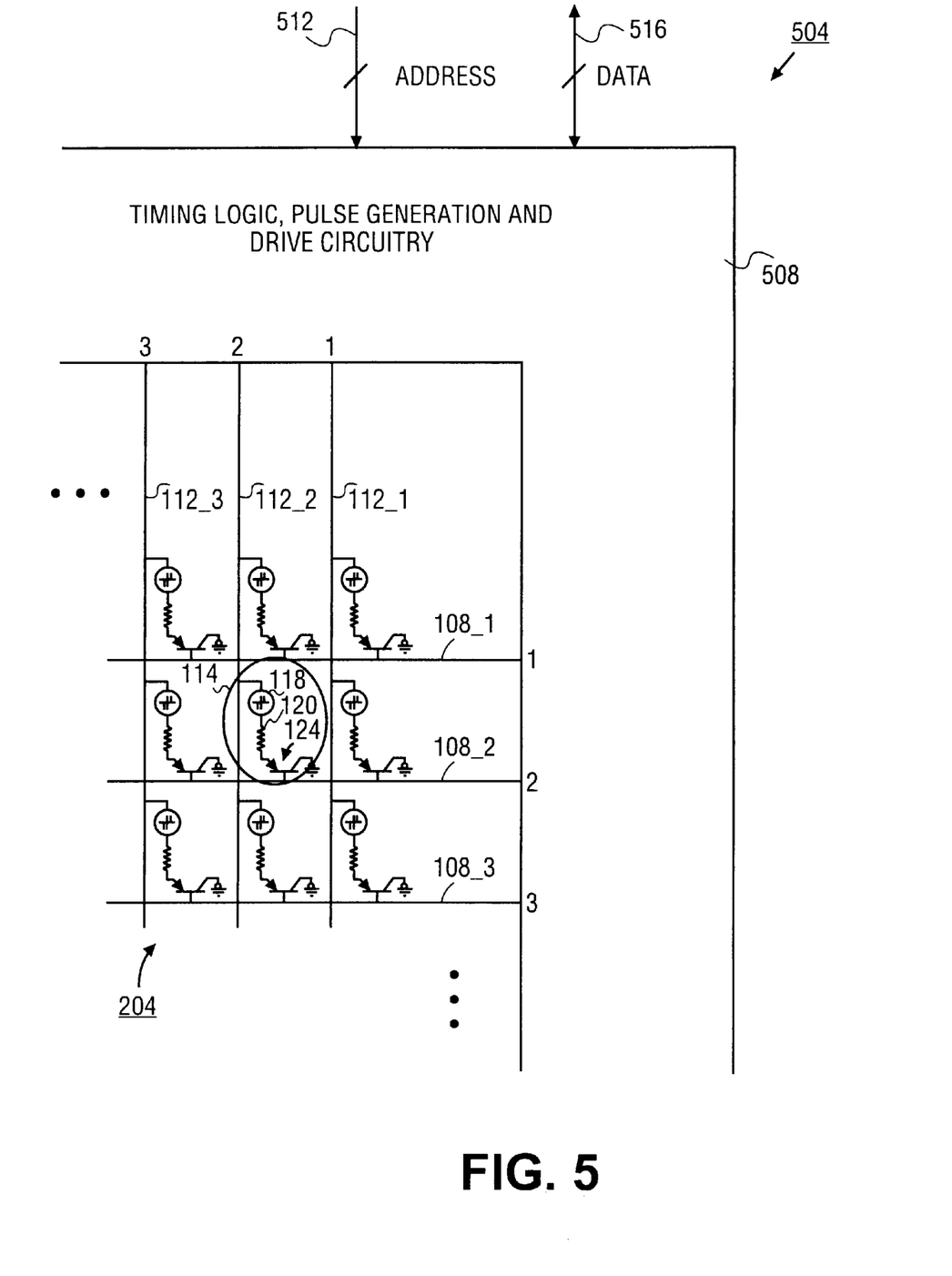
FIG. 5 illustrates a block diagram of part of an integrated circuit device designed to program its memory cell array according to an embodiment of the invention.

Referring now to FIG. 5, what's shown is a block diagram of part of an IC device 504 that uses a diode-based memory cell array 204. The IC device 504 includes timing logic pulse generation and drive circuitry 508 having a number of outputs each of which is coupled to a respective bitline 112 of the array 204. The circuitry 508 also has a number of outputs each of which is coupled to a respective wordline 108 of the array 204. These outputs of the circuitry 508 allow it to program target memory cell in the array 204 while simultaneously floating unselected ones of the bitlines and wordlines in the array 204. Conventional analog or digital circuit design techniques may be used to implement the pulse generation circuitry that is able to generate the required programming pulse voltage and current levels needed to program each cell. The circuitry 508 also includes timing logic to insure that the target memory cell is distinguished from the unselected cells, to avoid the loss of previously stored data in the cells of the array 204. The drive circuitry will insure that the generated pulses can be properly fanned out to more than one target cell simultaneously.

In addition to circuitry needed for the programming and floating operations described above in FIG. 4, the circuitry 508 may further include precharge circuitry to assist in performing the operation 404. This precharge circuitry can be implemented using conventional analog techniques that bring the unselected wordlines to the desired precharge levels, such as $V_{hi}-V_{diode}$, and the unselected bitlines to the desired precharge level, e.g. $V_{lo}+V_{diode}$. The circuitry 508 could then immediately thereafter float these unselected bitlines and wordlines, followed by application of the programming pulse to the selected bitline-wordline pair.

The circuitry 508 in the IC device 504 responds to input requests via address lines 512 and data lines 516 to write a single-bit or multi-bit data value to a given location in the array 204. Thus, the circuitry 508 includes the necessary decoding logic that translates the address information received on the address lines 512 into the appropriate bitline-wordline pairs in the array 204 that correspond to that location. Thus, it should be noted that although the above description refers to a single target memory cell being programmed, while unselected bitlines and wordlines in the memory device are floating, the concepts are also applicable to simultaneously program a number of target memory cells. For instance, depending upon the particular write request that has been received by the circuitry 508, a number of target memory cells that are coupled to the same wordline, and where each target cell is coupled to a different bitline, are to be programmed simultaneously. This means that there can be multiple bitline-wordline pairs which are selected simultaneously to be programmed.

The timing logic, pulse generation and drive circuitry 508 may be formed on the same IC die as the memory cell array 204, if doing so can take advantage of lower manufacturing costs and higher performance of on-chip integration techniques.

Figure 6:
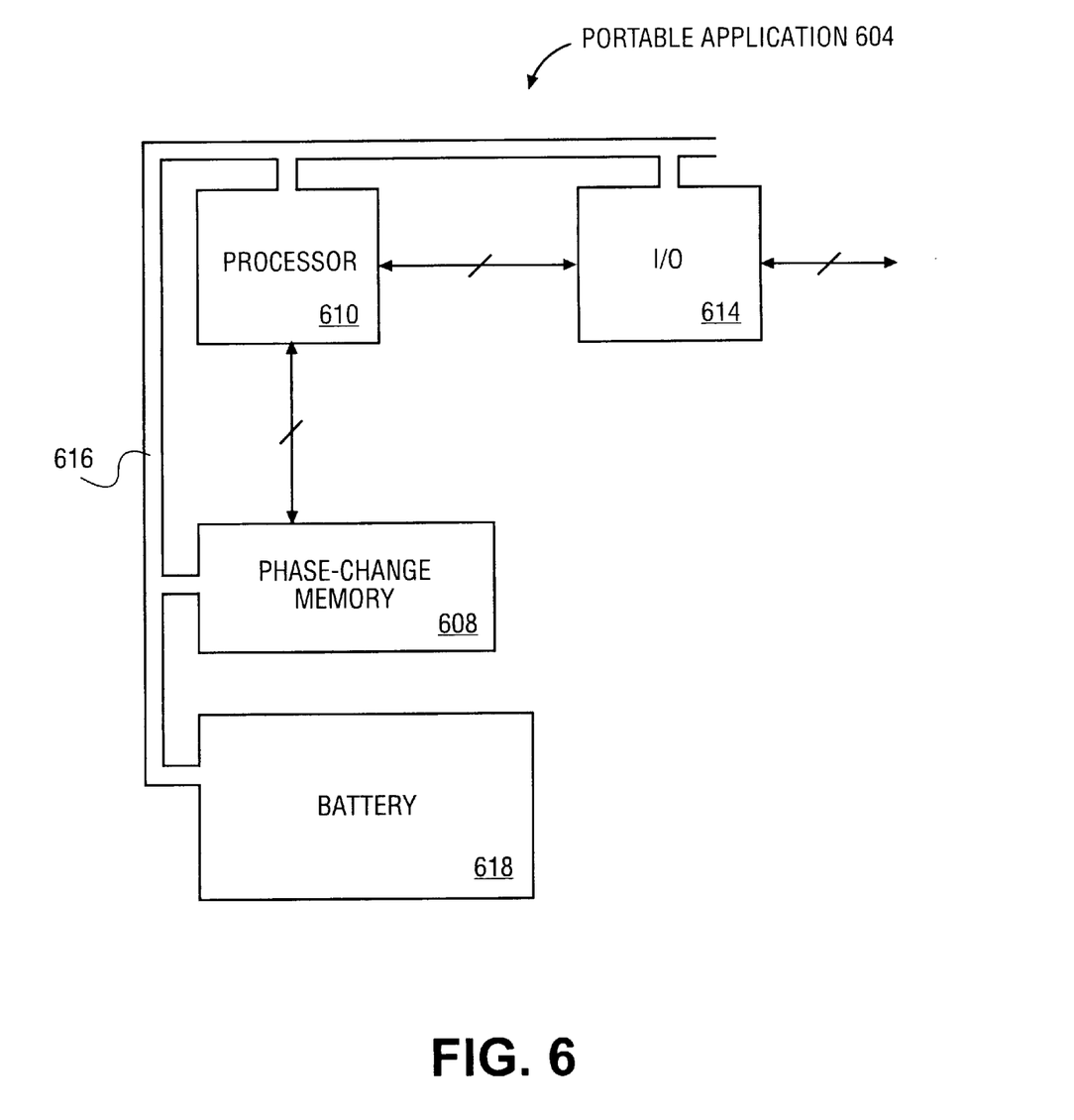
FIG. 6 depicts a block diagram of an embodiment of a portable application of a phase-change memory that incorporates the programming process.

FIG. 6 illustrates a block diagram of a portable application 604 of the phase-change memory programming process described above. A phase-change memory 608 is operated according to an embodiment of the programming process described above. The phase-change memory 608 may include one or more integrated circuit dies where each die has a memory array that is programmed according to the various embodiments of the programming techniques described above in FIGS. 1–5. These IC dies may be separate, stand alone memory devices that are arranged in modules such as conventional dynamic random access memory (DRAM) modules, or they may be integrated with other on-chip functionalities. In the latter embodiments, the phase-change memory 608 may be part of an I/O processor or a microcontroller.

The application 604 may be for instance a portable notebook computer, a digital still and/or video camera, a personal digital assistant, or a mobile (cellular) hand-held telephone unit. In all of these applications, an electronic system includes a processor 610 that uses the phase-change memory 608 as program memory to store code and data for its execution. Alternatively, the phase-change memory 608 may be used as a mass storage device for non-volatile storage of code and data. The portable application 604 communicates with other devices, such as a personal computer or a network of computers via an I/O interface 614. This I/O interface 614 may provide access to a computer peripheral bus, a high speed digital communication transmission line, or an antenna for unguided transmissions. Communications between the processor and the phase-change memory 608 and between the processor and the I/O interface 614 may be accomplished using conventional computer bus architectures.

The above-described components of the portable application 604 are powered by a battery 618 via a power supply bus 616. Since the application 604 is normally battery powered, its functional components including the phase-change memory 608 should be designed to provide the desired performance at low power consumption levels. In addition, due to the restricted size of portable applications, the various components shown in FIG. 6 including the phase-change memory 608 should provide a relatively high density of functionality. Of course, there are other non-portable applications for the phase-change memory 608 that are not shown. These include, for instance, large network servers or other computing devices which may benefit from a non-volatile memory device such as the phase-change memory.

To summarize, various embodiments of a biasing scheme of floating unselected wordlines and bitlines of a diode-based memory array have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, the invention is also applicable to memory arrays in which the diodes are oriented in the opposite direction than that shown in the figures, so that their forward current is in the wordline-to-bitline direction. The specification and drawings are, accordingly, to be regarded in an illustrative rather than a restrictive sense.

What is claimed is:

1. A method comprising:

floating a plurality of unselected bitlines and a plurality of unselected wordlines of an integrated circuit (IC), the IC having a plurality of memory cells each of which has a diode structure coupled between a bitline and a wordline that are selected when programming that cell; and programming a target memory cell of the IC while simultaneously floating said plurality of unselected bitlines and said plurality of unselected wordlines.

2. The method of claim 1 wherein the programming includes applying a pulse to a selected bitline and a selected wordline of the IC so as to cause the diode structure in the target memory cell to be pulsed in a forward bias direction, wherein the unselected bitlines and wordlines remain floating during the pulse.

3. The method of claim 2 further comprising:

precharging the plurality of unselected bitlines and wordlines and then floating them, before applying the pulse to the selected bitline and wordline.

4. A method comprising:

providing each of a plurality of unselected bitlines and a plurality of unselected wordlines of an integrated circuit (IC) with high impedance to a power supply node and a power return node of the IC, the IC having a plurality of memory cells each of which has a diode structure coupled between a bitline and a wordline that are selected when programming that cell; and programming a target memory cell of the IC while simultaneously providing said high impedance to said plurality of unselected bitlines and said plurality of unselected wordlines.

5. The method of claim 4 wherein the programming includes applying a pulse to a selected bitline and a selected wordline of the memory IC so as to cause the diode structure in the target memory cell to be pulsed in a forward bias direction, wherein the unselected bitlines and wordlines continue to have said high impedance during the pulse.

6. The method of claim 5 further comprising:

precharging the plurality of unselected bitlines and wordlines and then causing them to have said high impedance, before applying the pulse to the selected bitline and wordline.

7. The method of claim 4 wherein said high impedance is sufficiently high so that essentially no cell connected to an unselected bitline or an unselected wordline has its diode structure reverse-biased by more than essentially $V_{hi}-V_{lo}-2*V_{diode}$ where $V_{hi}-V_{lo}$ is the maximum programming voltage between a selected bitline and a selected wordline and $V_{diode}$ is a forward voltage drop of its diode structure.

8. The method of claim 4 wherein said high impedance is obtained by placing in cutoff all transistors that directly drive the plurality of unselected wordlines and the plurality of unselected bitlines.

9. An integrated circuit device comprising:

a plurality of bitlines and a plurality of wordlines;

a plurality of memory cells each of which has a diode structure coupled between a separate bitline-wordline pair of the plurality of bitlines and of the plurality of wordlines, the pair to be selected when programming that cell; and timing logic, pulse generation and drive circuitry coupled to the plurality of bitlines and wordlines, to program a target memory cell of the plurality of memory cells while simultaneously floating unselected ones of said plurality of bitlines and unselected ones of said plurality of wordlines.

10. The integrated circuit device of claim 9 wherein the timing logic, pulse generation and drive circuitry is to program the target memory cell by applying a pulse to a selected bitline-wordline pair so as to cause the diode structure in the target memory cell to be pulsed in a forward bias direction, wherein the unselected bitlines and the unselected wordlines remain floating during the pulse.

11. The integrated circuit device of claim 10 wherein the timing logic, pulse generation and drive circuitry further includes precharge circuitry coupled to precharge the unselected bitlines and the unselected wordlines and then float them, before applying the pulse to the selected bitline-wordline pair.

12. The integrated circuit device of claim 9 wherein the timing logic, pulse generation and drive circuitry is to simultaneously program a plurality of target memory cells, of the plurality of memory cells, while simultaneously floating unselected ones of said plurality of bitlines and unselected ones of said plurality of wordlines.

13. The integrated circuit device of claim 12 wherein each of the plurality of target memory cells is coupled to the same wordline and a different bitline.

14. The integrated circuit device of claim 9 wherein each of the plurality of memory cells further includes a structural phase-change material in series with the diode structure and coupled between the bitline-wordline pair of that cell, the material of that cell is to change into a predetermined phase when that cell has been programmed.

15. The integrated circuit device of claim 9 wherein the plurality of bitlines, the plurality of wordlines, the plurality of memory cells, and the timing logic, pulse generation and drive circuitry are all formed on the same integrated circuit die.

16. An integrated circuit device comprising:

a plurality of bitlines and a plurality of wordlines;

a plurality of memory cells each of which has a diode structure coupled between a separate bitline-wordline pair of the plurality of bitlines and of the plurality of wordlines, the pair to be selected when programming that cell; and timing logic, pulse generation and drive circuitry coupled to the plurality of bitlines and wordlines, to program a target memory cell of the plurality of memory cells while simultaneously causing unselected ones of said plurality of bitlines and unselected ones of said plurality of wordlines to have high impedance to a power supply node and a power return node of the device.

17. The integrated circuit device of claim 16 wherein the timing logic, pulse generation and drive circuitry is to program the target memory cell by applying a pulse to a selected bitline-wordline pair so as to cause the diode structure in the target memory cell to be pulsed in a forward bias direction, wherein the unselected bitlines and the unselected wordlines continue to have said high impedance during the pulse.

18. The integrated circuit device of claim 17 wherein the timing logic, pulse generation and drive circuitry further includes precharge circuitry coupled to precharge the unselected bitlines and the unselected wordlines and then cause them to have said high impedance, before applying the pulse to the selected bitline-wordline pair.

19. The integrated circuit device of claim 16 wherein the high impedance is sufficiently high so that essentially no cell connected to an unselected bitline or an unselected wordline has its diode structure reverse-biased by more than essentially $V_{hi}-V_{lo}-2*V_{diode}$ where $V_{hi}-V_{lo}$ is the maximum programming voltage between a selected bitline-wordline pair and $V_{diode}$ is a forward voltage drop of its diode structure.

20. The integrated circuit device of claim 16 wherein said high impedance is obtained by placing in cutoff all transistors that directly drive the plurality of unselected wordlines and the plurality of unselected bitlines.

* * * * *